United States Patent [19]

Morgan

[11] 4,019,185
[45] Apr. 19, 1977

[54] PHASE MODULATION APPARATUS

[75] Inventor: Arthur Picton Morgan, Farnborough, England

[73] Assignee: The Secretary of State for Defence in Her Britannic Majesty's Government of the United Kingdom of Great Britain and Northern Ireland, London, England

[22] Filed: May 23, 1973

[21] Appl. No.: 365,090

[30] Foreign Application Priority Data

May 30, 1972 United Kingdom ............ 25344/72

[52] U.S. Cl. .......................... 343/17.2 R; 325/140; 343/7 PF; 343/17.5
[51] Int. Cl.² ...................... G01S 7/28; G01S 9/38
[58] Field of Search ........... 343/17.2 R, 7 PF, 17.5; 325/140

[56] References Cited

UNITED STATES PATENTS

| 3,305,863 | 2/1967 | Jacobs | 343/18 D |
|---|---|---|---|
| 3,308,464 | 3/1967 | Lewis | 343/18 D |
| 3,341,849 | 9/1967 | Cordry et al. | 343/17.2 R X |
| 3,371,345 | 2/1968 | Lewis | 343/18 D |
| 3,390,391 | 6/1968 | Kissinger et al. | 343/17.2 R |
| 3,413,635 | 11/1968 | Moore | 343/17.2 R |
| 3,663,935 | 5/1972 | MacMullen | 343/17.2 R |

Primary Examiner—Malcolm F. Hubler
Attorney, Agent, or Firm—Stevens, Davis, Miller & Mosher

[57] ABSTRACT

Phase modulation apparatus particularly suitable for coherent radar applications wherein an interrupted carrier-wave is phase modulated according to a predetermined coded sequence. Apparatus comprises a carrier wave generator having an output for connection to an aerial, a delay line suitably coupled at one end to the output of the generator, and a modulation signal generator for controlling the reflecting actions of a reflector at the other end of the delay line so that signals travelling in the delay line are reflected with a phase-shift dependent on the signal produced by the modulation signal generator. The carrier-wave generator is switched on and off for transmit and receive periods respectively and when switched on its output signal will build up from noise levels injection-phase-locked to a delayed version of the previous transmitted signal, thus preserving phase coherence between successive transmitted signals.

7 Claims, 1 Drawing Figure

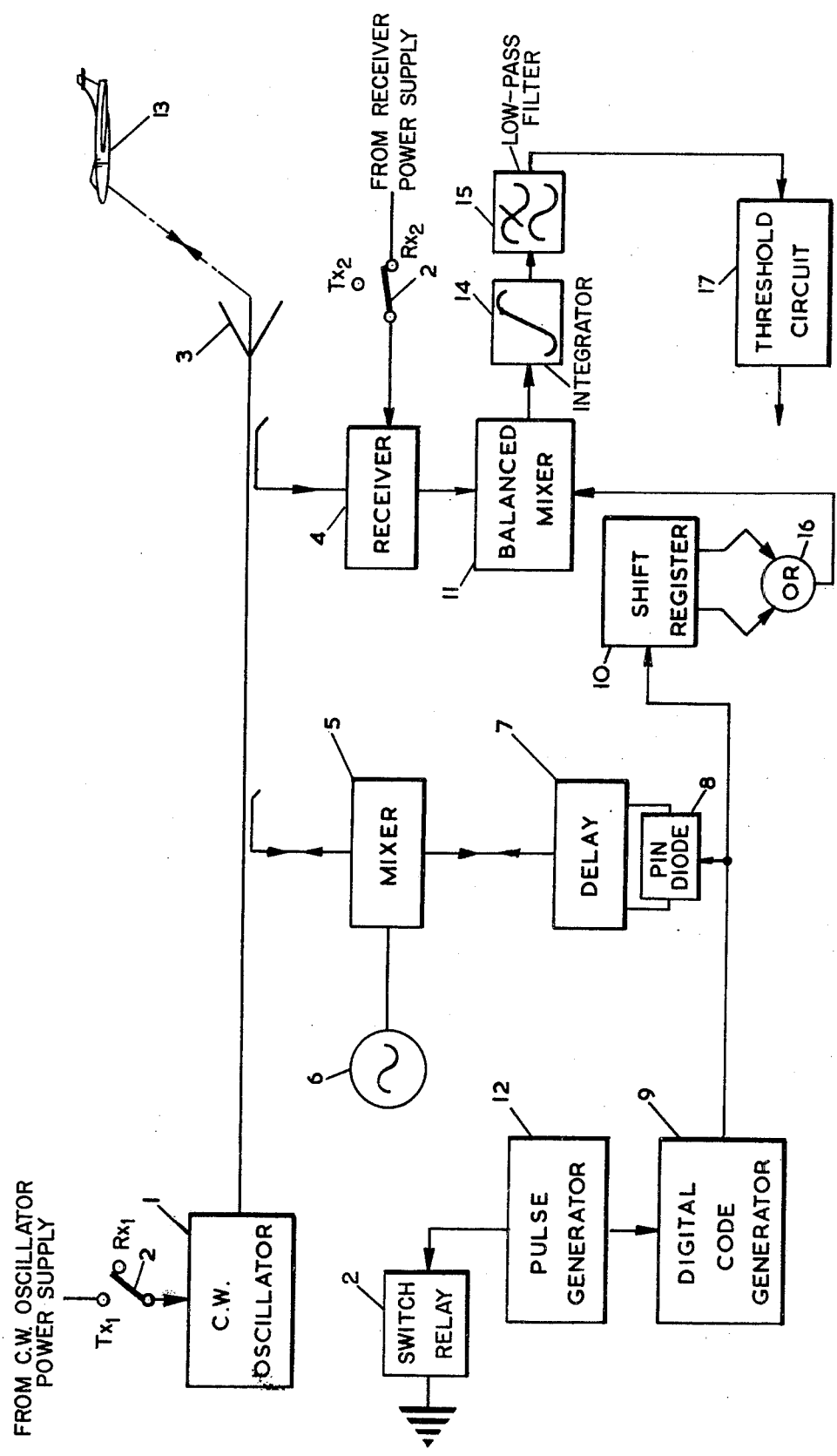

PHASE MODULATION APPARATUS

The present invention relates to radio signalling equipment and in particular to apparatus for modulating transmitted signals at a transmitter.

In known radar apparatus, it is common to use a bi-phase modulated carrier wave as the transmitted signal to provide a coded sequence of transmitted signals which can also be delayed and correlated with signals reflected from a target and received at a receiver to give the required target range information. The modulation of the carrier wave is achieved by phase shift keying techniques in which the keying operations are controlled by the output of a digital code generator. Where a common aerial is used for transmission and reception, the coded sequence of transmitted signals must be provided with reception intervals during which signals from a target may be received. Although the transmission sequence is interrupted the carrier wave oscillator must not be switched off in the known apparatus or the phase relationship between succesive transmissions is not maintained. Because of this unwanted signals from the transmission oscillator can break through on the received signal during the reception intervals which is at a relatively low level.

It is an object of this invention to provide phase modulation apparatus in which the carrier wave oscillator may be switched off during reception intervals and yet the phase relationship between successive transmissions maintained.

According to the present invention, phase modulation apparatus includes a carrier wave oscillator having an output for connection to an aerial, a delay line suitably coupled at one end to the output of the oscillator, modulation signal generator means and reflection means both at the other end of the delay line for reflecting signals travelling in the delay line with a phase shift determined by the instantaneous magnitude of a signal from the modulation signal generator means.

The reflection means may for example be a varactor the capacitance of which is determined by the instantaneous magnitude of the modulation signal and which determines the particular phase shift given to the reflected signals.

A bi-phase modulation form of the apparatus includes a carrier wave oscillator having an output for connection to an aerial, a delay line suitably coupled at one end to the output of the oscillator, binary code generator means for generating a predetermined sequence of binary pulses, and reflecting means at the other end of the delay line for correspondingly reflecting successive signals with one of two predetermined phase shifts as determined by the sequence. In this form of the apparatus the reflection means may be a pin-diode which presents a short-circuit to an open-circuit at the end of the delay line as determined by the instantaneous binary signal applied to it from the binary code generator.

Where the signal to be transmitted is a microwave frequency carrier wave suitably modulated, the microwave signal is preferably mixed with a signal of a suitable frequency at the output from a local oscillator in a signal mixer circuit suitably coupled to the output of the carrierwave oscillator and connected to the delay line so that the frequency of the mixed signal is suitable for application to the delay line. The delay line is preferably a surface wave acoustic delay line of ½-bit length, the duration of a bit being pre-determined by the on/off repetition rate of a transmit/receive switch. The carrier wave oscillator is switched on and off at the bit rate by the transmit/receive switch and should preferably be off for a longer period than it is on in order to minimize the loss of received signals and to reduce the peak to mean power ratio of the transmitter. In the bi-phase modulation form the operations of the binary code generator should be synchronized to the operations of the transmit/receive switch.

An embodiment of the invention will now be described by way of example only and with reference to the accompanying drawing which shows a schematic circuit diagram of a bi-phase modulation apparatus and parts of transmitter and receiver circuits of a proximity fuse radar.

The apparatus shown in the diagram is mounted in a weapon (not shown) for example an antiaircraft projectile.

A carrier wave oscillator 1 is connected so as to be switched on and off by the operations of a transmit/receive switch 2. The oscillator 1 has an output which is connected to a transmitter/receiver aerial 3. A receiver shown generally at 4 is controlled by the transmit/receive switch 2, such that when the oscillator 1 is switched off the receiver 4 is switched on and receives signals from the aerial 3. The receiver 4 will not be described in detail here, but it is, or can be, of a type described in the inventor's co-pending UK Pat. application No. 58827/71. The output of the oscillator 1 is also coupled to the signal port of a mixer 5. A local oscillator 6 has an output connected to the local oscillator input of the mixer 5. The frequency of the local oscillator 6 is chosen such that the microwave frequencies applied to the signal port of the mixer 5 are converted to frequencies which are suitable for application to a surface acoustic delay line 7, and conversely the signals received from the surface acoustic delay line 7 have their frequencies up-converted by the mixer 5 so that microwave signals are again coupled to the oscillator 1/aerial 3 line. The other end of the delay line 7 is connected to a pin-diode 8. A pseudo-random signal code generator 9 has an output connected to control the state of the pin-diode 8. When the output of the code generator 9 is at one level, the pin-diode 8 will reflect signals received at its end of the delay line 7 without substantially changing the phase of that signal. However, when the output of the code generator 9 is at its other level, the pin-diode 8 will cause the signals received at its end of the delay line 7 to be reflected with a phase change of 180°. The output of the code generator 9 is also connected via a suitable shift register 10 to the local oscillator input of a balanced mixer circuit 11, the signal port of which is connected to the output of the receiver 4. The purpose of this further output of the code generator 9 is to provide means for determining the range of a target detected by the radar. This arrangement is not described in detail here but is described in the applicant's co-pending application 58827/71. The output of the code generator 9 is a series of pulses of one level or another, each pulse being of duration 400 nano-seconds and the interval between pulses being 600 nano-seconds. The digital code generator 9 is a single shift register, with feed back arranged to produce a suitable length pseudo-random sequence of digital pulses, wherein the shift operations of the shift register are controlled by a pulse generator 12. The pulse generator 12 also controls the relay of and therefore the operations of the transmit/receive switch 2, so that the oscillator 1 is switched on for a period of 400 nano-seconds and is switched off for a period of 600 nano-seconds. Each bit of information, therefore, occupies a time period of 400 nano-seconds plus 600 nano-seconds, i.e. a bit recurrence period is 1 microsecond. The delay line 7 is of ½-bit length.

In operation when the oscillator 1 is first switched on by the transmit/receive switch 2, a microwave signal of 400 nano-seconds duration is transmitted by the aerial 3. This signal is also coupled via the mixer circuit 5 to the surface acoustic delay line 7. After a period of 500 nano-seconds, corresponding to ½-bit delay, this signal will have reached the end of the delay line 7. Depending on the polarity of the pulse currently being received by the pin-diode 8 from the code generator 9, this signal is either reflected at the end of the delay line 7 with zero phase reversal or with a phase reversal of 180°. After propagating back along the surface acoustic delay line and up converting in the mixer circuit 5, this signal is re-coupled to the output of the oscillator circuit 1. This occurs just as the transmit/receive switch 2 is about to switch the oscillator 1 on for the second time. In this way instead of the output of the oscillator 1 building up from noise, the oscillations on the delayed signal already present on its output line force the oscillator to build up in phase with that signal. Phase coherence between successive operations of the oscillator 1 is therefore maintained. The aerial 3 thus transmits the sequence of bursts of the carrier wave each of 400 nano-seconds duration, the phases of which are directly proportional to the digital code being generated by the digital code generator 9. Between each transmitting burst a period of 600 nano-seconds is allowed in which pulses may be received after reflection from a target 13. Clearly the receipt of a single pulse during one of the 600 nano-seconds reception periods is not an indication of the range of the target, since it would not be known which transmitted pulse this received pulse corresponded to. However, by cross correlating a sequence of received pulses with a delayed version of the transmitted sequence of pulses in the mixer 11, as described in the applicant's co-pending application No. 58827/71, and filtering and integrating the output of the cross-correlator with an integrator 14 and a filter 15 over a sufficiently long period, this ambiguity is resolved. The output of the filter 15 will build up to a triggering level whenever the target 13 comes within a range determined by the given delay applied to the sequence of the pulses from the digital code generator 9 by the shift register 10, and applied to the mixer 11. A threshold circuit 17 connected to the output of the filter 15 then produces an output indicating the presence of the target 13 and setting off the fuse (not shown) of the weapon (not shown) in which the apparatus is mounted.

The receiver 4 preferably includes the arrangement described in the applicant's co-pending application 58827/71 whereby each received pulse is first auto-correlated with a one-bit-delayed version of the proceeding pulse in order to overcome carrier-frequency variations due for example to the doppler effect. In this case, as described in the co-pending application mentioned above, the output of the digital code generator 9 delayed by the shift register 10 is processed by a suitable exclusive-OR gate 16 in order that the subsequent cross correlation by the mixer 11 is meaningful.

Many variations and applications of the embodiment described above will now suggest themselves to ones skilled in this art. For example a varactor can be used as the reflection means instead of the pin-diode. The variations in capacitance of the varactor in response to a modulation signal applied to it then control the phase shift applied to the signals at the end of the delay line, in a manner directly proportional to the instantaneous magnitude of the modulation signal. The transmitted signal in this case is a regular sequence of equal duration bursts of the carrier wave phase-modulated by the modulation signal. Provided the repetition rate of these bursts is at least ten times the maximum frequency of the modulation, the receiver can resolve and faithfully reproduce the modulation signal. The apparatus may thus be used as a truly linear phase shift modulator, and the transmitted signal will be free from the superimposed unwanted amplitude-modulation which is generally produced by other phase shift modulation techniques. In this form the apparatus may be used to form a signal bearing a synthetic simulation of a Doppler effect.

I claim:

1. Phase modultion apparatus for an interrupted carrier-wave coherent radar comprising; carrier-wave generator means for generating a carrier-wave signal of a predetermined frequency during transmit periods and having signal output means for connection to an aerial; transmit/receive switch means connected to a power supply control input of the carrier-wave generator means; pulse generator means connected to a control input of the transmit/receive switch means for producing alternately transmit pulses and receive pulses of predetermined and non-overlapping periods, each of said transmit pulses being operative to cause the transmit/receive switch means to switch on a power supply to the carrier-wave generator means for a transmit period and each of said receive pulses being operative to cause the transmit/receive switch means to switch off the power supply to the carrier-wave generator means for a receive period; a delay line coupled at one end to the signal output means of the carrier-wave generator means; reflector means at the other end of the delay line for reflecting signals produced by the carrier-wave generator means during a transmit period and travelling in the delay line; and, modulation signal generator means connected to the reflector means and synchronously connected to the pulse generator means for controlling the reflecting actions of the reflector means so that signals travelling in the delay line are reflected with a phase-shift dependent on a modulation signal produced by the modulation signal generator means and arrive back at the signal output means substantially at but not after the commencement of the next transmit period, the phase of the reflected signal determining by injection phase-locking the phase of the carrier-wave signal produced by the carrier-wave generator means during a transmit period as compared with the phase of the carrier-wave signal produced during the preceding transmit period.

2. Phase modulation apparatus as claimed in claim 1 and wherein the reflector means comprises a varactor, the instantaneous capacitance of which is determined by the instantaneous magnitude of the modulation signal produced by the modulation signal generator means, said capacitance determining the particular phase shift given to the reflected signals.

3. Phase modulation apparatus as claimed in claim 1 and wherein the modulation signal generator means comprises binary code generator means for generating a modulation signal comprising a predetermined sequence of binary pulses and the reflector means comprises means for reflecting signals travelling in the delay line with a corresponding sequence of one and the other of two predetermined phase shifts.

4. Phase modulation apparatus as claimed in claim 3 and wherein the reflector means comprises a pin-diode which presents, in the corresponding sequence, a short-circuit and an open-circuit at the end of the delay line.

5. Phase modulation apparatus as claimed in claim 1 and wherein the carrier-wave generator means comprises means for generating a microwave frequency carrier-wave, and wherein the apparatus further comprises signal mixer means for producing a signal of a first frequency suitable for application to said delay line, said signal mixer means being coupled at one input to the signal output means of the carrier-wave generator means, is connected at a further input to local oscillator means for producing a signal at a second frequency, and is connected at an output to said one end of the delay line, said second frequency being chosen such that when the signal from the local oscillator means is mixed in the signal mixer means with the microwave frequency carrier-wave the signal mixer means produces said first frequency at its output.

6. Phase modulation apparatus as claimed in claim 3 and wherein the pulse generator means produces a continuous stream of equally spaced and equal duration pulses, the sum of the durations of one pulse and one space being of one bit duration, and wherein the delay line is a surface-wave acoustic delay line of a length equivalent to a delay of a half-bit duration and the binary code generator means is connected to said pulse generator means so that the sequence of binary pulses is synchronized with the on and off switching operations of the switch means.

7. Phase modulation apparatus as claimed in claim 6 and wherein the pulses produced by said pulse generator means are such that the duration for which the carrier-wave generator means is switched off by said switch means is longer than the duration for which it is switched on.

* * * * *